(12) United States Patent
Liu et al.

(10) Patent No.: US 6,305,648 B1
(45) Date of Patent: Oct. 23, 2001

(54) PANEL AND DRIVE CAGE ASSEMBLY

(75) Inventors: Yu-Tai Liu, Hsin-Chuang; Yun Long Chen, Chung-Ho; Alvin Liu, Pa-Li, all of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/437,809

(22) Filed: Nov. 10, 1999

(30) Foreign Application Priority Data

Dec. 28, 1998 (TW) ............................................. 87221628 U

(51) Int. Cl.⁷ ........................................................ G12B 9/00
(52) U.S. Cl. ........................ 248/27.1; 312/223.2; 248/694
(58) Field of Search ................... 248/27.1, 27.3, 248/694; 361/685, 725, 726, 727, 728, 747; 312/223.2, 223.1, 263, 257.1

(56) References Cited

U.S. PATENT DOCUMENTS

| | | | |
|---|---|---|---|
| 4,561,615 | * 12/1985 | Medlin, Jr. ........................... | 248/27.1 |
| 4,688,131 | * 8/1987 | Noda et al. ........................... | 360/137 |
| 5,031,070 | * 7/1991 | Hsu ...................................... | 361/380 |
| 5,124,885 | * 6/1992 | Liu ....................................... | 361/391 |
| 5,164,886 | * 11/1992 | Chang .................................. | 361/390 |
| 5,175,670 | * 12/1992 | Wang ................................... | 361/390 |
| 5,485,348 | * 1/1996 | Oros ..................................... | 361/685 |
| 5,600,538 | * 2/1997 | Xanthopoulos ...................... | 361/683 |
| 5,657,202 | * 8/1997 | Ma ....................................... | 361/683 |
| 5,828,547 | * 10/1998 | Francovich et al. ................. | 361/685 |
| 5,986,881 | * 11/1999 | Yang .................................... | 361/685 |
| 5,992,955 | * 11/1999 | Yang .................................... | 312/265.6 |
| 6,030,062 | * 2/2000 | Chen et al. .......................... | 312/223.2 |
| 6,158,699 | * 12/2000 | Boe ...................................... | 248/27.1 |
| 6,179,397 | * 1/2001 | Liao ..................................... | 312/223.2 |

FOREIGN PATENT DOCUMENTS

29715909-U1 * 4/1997 (DE) .

* cited by examiner

*Primary Examiner*—Anita King
*Assistant Examiner*—Naschica S Morrison
(74) *Attorney, Agent, or Firm*—Wei Te Chung

(57) ABSTRACT

A panel and drive cage assembly includes a panel and a drive cage attached to the panel. The panel defines an opening therein for providing access to the drive cage. A flange extends about the opening of the panel. A number of fingers extend from the flange. The drive cage forms a number of protrusions to extend through the opening and contact the corresponding fingers of the panel for enhancing grounding.

5 Claims, 4 Drawing Sheets

PANEL AND DRIVE CAGE ASSEMBLY

BACKGROUND OF THE INVENTION

1. Field of the Invention

The present invention relates to a panel and drive cage assembly, and particularly to a panel and drive cage assembly having means for enhancing grounding of the drive cage mounted thereto.

2. The Related Art

A panel and drive cage assembly includes a drive cage for receiving and retaining a data storage device such as a floppy disk drive (FDD), a hard disk drive (HDD) or a compact disc-read only memory (CD-ROM) drive. The data storage device can easily produce electromagnetic interference which can reduce the stability of the computer system. To counter this problem, a drive cage such as those disclosed in Taiwan Patent Application Nos. 84213528, 85218324, 81213379 and 84201628, and U.S. Pat. Nos. 5,031,070; 5,600,538; 5,164,886 and 5,175,670 is required to quickly ground for preventing the electromagnetic interference coming from the data storage device.

A conventional panel and drive cage assembly forms a plurality of fingers connected between a drive cage and a front panel to provide grounding paths, thereby enhancing grounding. However, attaching the fingers to the front panel is complicated and time consuming.

Thus, it is desired to have a panel and drive cage assembly having a drive cage which facilitates grounding and assembly.

SUMMARY OF THE INVENTION

Accordingly, an object of the present invention is to provide a panel and drive cage assembly comprising a drive cage having means for facilitating grounding.

Another object of the present invention is to provide a panel and drive cage assembly comprising a drive cage having a simplified assembly.

To fulfill the objects mentioned above, a panel and drive cage assembly in accordance with the present invention comprises a panel and a drive cage attached to the panel. The panel defines an opening therein and forms a plurality of fingers about the opening. The drive cage forms a plurality of protrusions proximate side edges thereof to extend through the opening and contact the corresponding fingers of the panel for enhancing grounding.

Other objects and advantages of the present invention will be understood from the following description of a preferred embodiment thereof with reference to the accompanying drawings, wherein:

DETAILED DESCRIPTION OF THE PREFERRED EMBODIMENT

Figure 1:
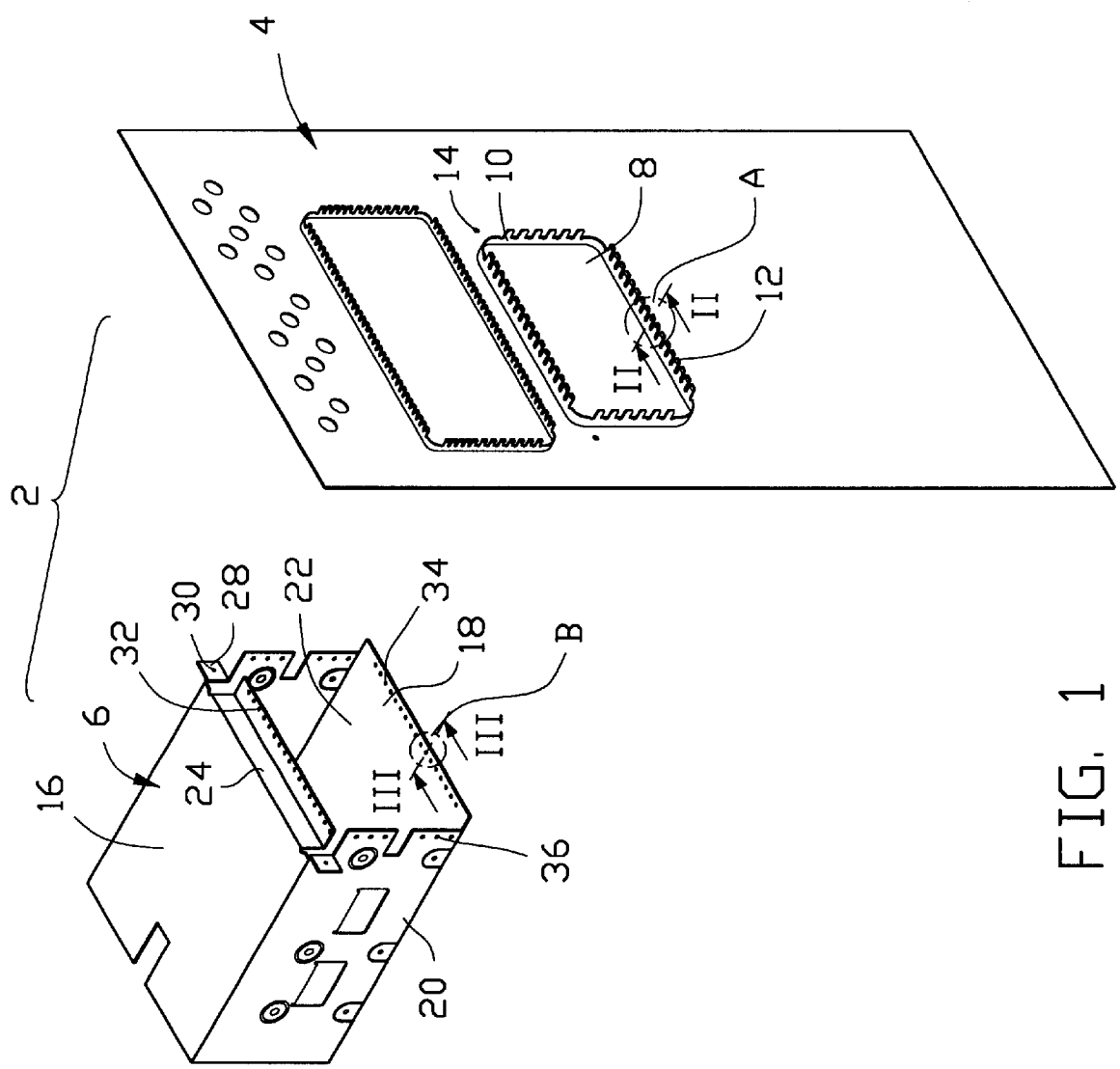
FIG. 1 is an exploded view of a panel and drive cage assembly in accordance with the present invention.
Figure 3:
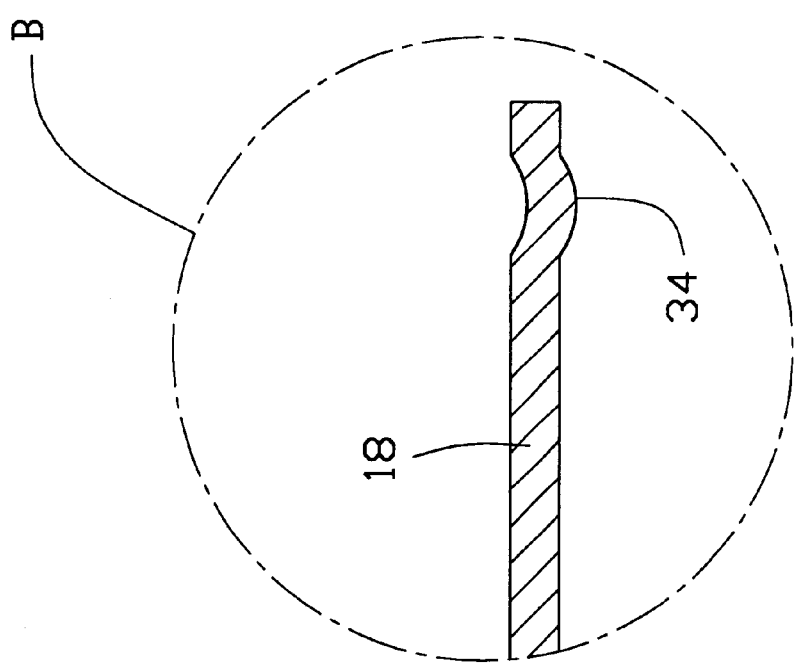
FIG. 3 is an enlarged sectional view taken along line III—III of FIG. 1.
Figure 2:
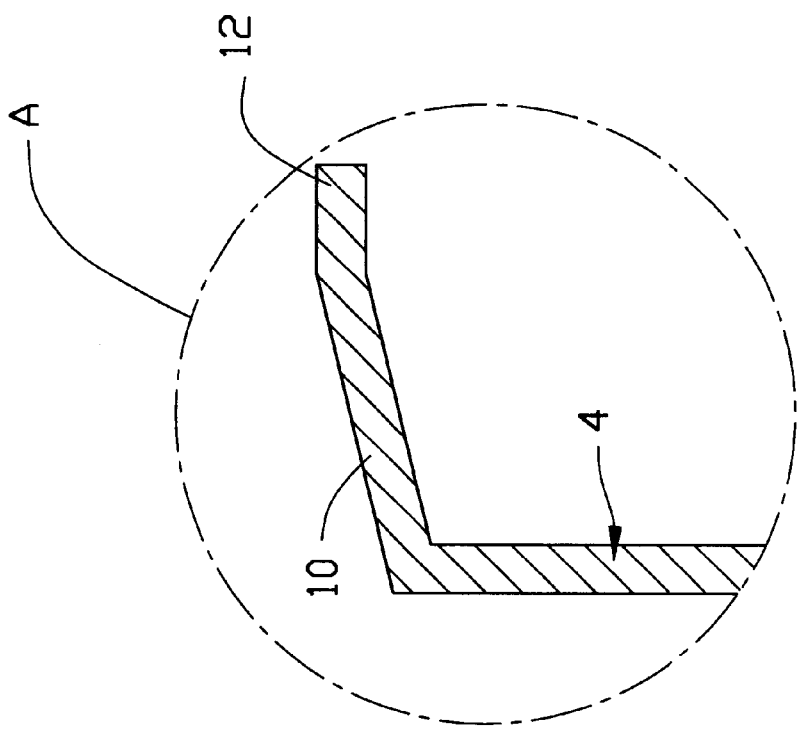
FIG. 2 is an enlarged sectional view taken along line II—II of FIG. 1.

Referring to FIGS. 1–3, a panel and drive cage assembly 2 in accordance with the present invention comprises a panel 4 and a drive cage 6 attached to the panel 4. The panel 4 defines a rectangular opening 8 for providing access to the drive cage 6. The panel 4 forms four flanges 10 extending forwardly and inclinedly from four edges of the opening 8, and a plurality of fingers 12 extends straightly forwardly from a front end of each of the flanges 10 for contacting the drive cage 6 thereby enhancing grounding. A pair of apertures 14 is defined in the panel 4 proximate the opening 8.

The drive cage 6 includes a top board 16, a bottom board 18 and a pair of side walls 20 connected between the top and bottom boards 16, 18 to define a receiving space 22 for receiving a data storage device therein (not shown). The top board 16 forms a stepped portion 24 for abutting against the panel 4. Each side wall 20 forms a transverse tab 28 for abutting against the panel 4. Each tab 28 defines a hole 30 corresponding to the aperture 14 of the panel 4 for extension of a fastener (not shown) to securely fix the drive cage 6 to the panel 4. A plurality of protrusions 32, 34, 36 extends from the stepped portion 24 of the top board 16, the bottom board 18 and the side walls 20 proximate a side edge thereof for contacting the corresponding fingers 12 of the panel 4 thereby enhancing grounding.

Figure 4:
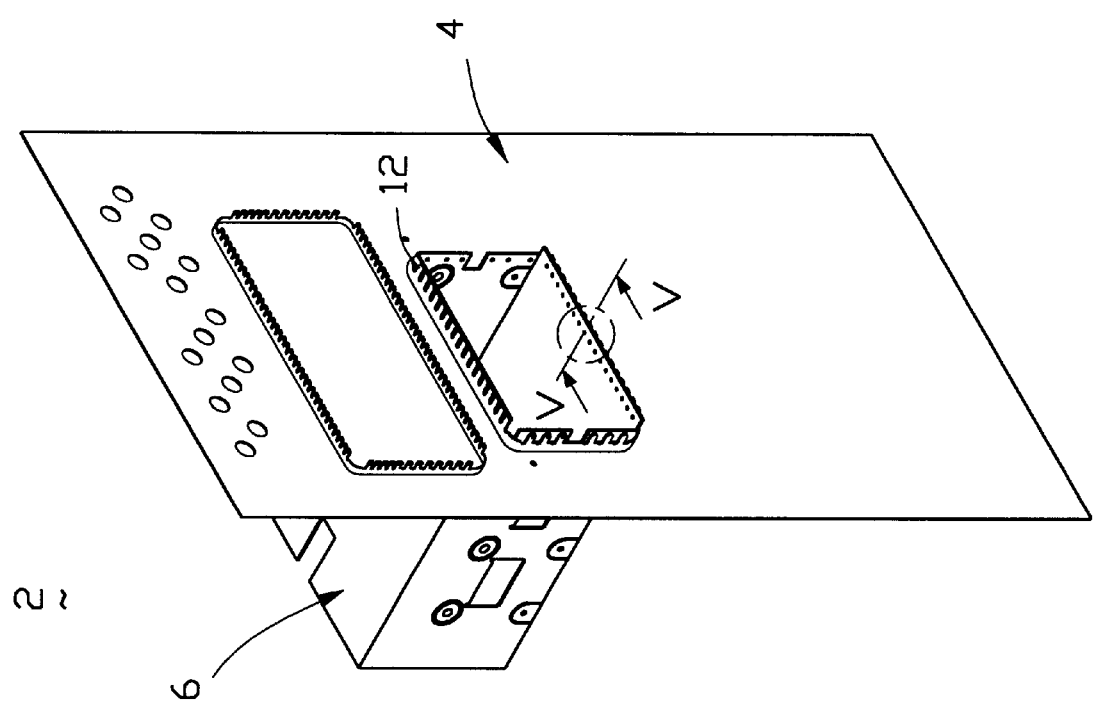
FIG. 4 is an assembled view of FIG. 1.
Figure 5:
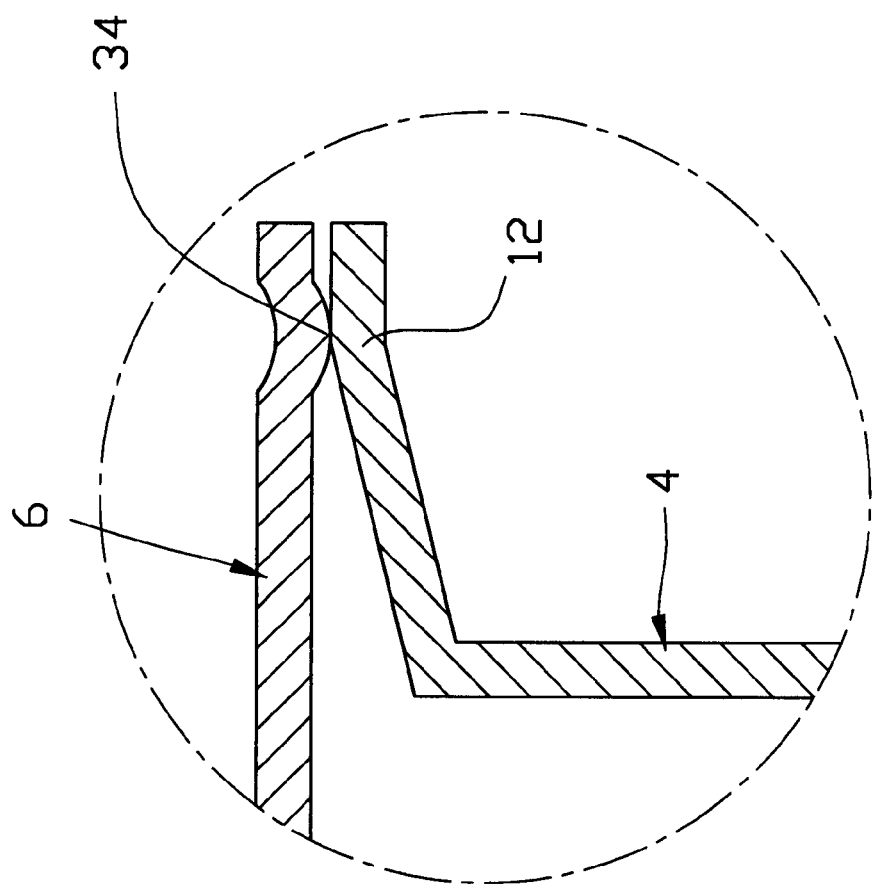
FIG. 5 is an enlarged sectional view taken along line V—V of FIG. 4.

Referring to FIGS. 1, 4 and 5, in assembly, the drive cage 6 is inserted into the opening 8 of the panel 4 with the stepped portion 24 and the tabs 28 abutting against the panel 4. The protrusions 32, 34, 36 of the drive cage 6 contact the corresponding fingers 12 of the panel 4 thereby enhancing grounding. Thus, it is easy to assemble the drive cage 6 to the panel 4.

It will be understood that the present invention may be embodied in other forms without departing from the spirit thereof. The present example and embodiment, therefore, is to be considered in all respects as illustrative and not restrictive, and the invention is not to be limited to the details given herein.

What is claimed is:

1. A panel and drive cage assembly comprising:
   a panel defining an opening and integrally forming a plurality of flanges extending forwardly and inclinedly from corresponding edges of the opening, a plurality of fingers extending forwardly from each of the flanges; and
   a drive cage attached to the panel and accessible through the opening, the drive cage forming a plurality of protrusions contacting the fingers of the panel to enhance grounding.

2. The panel and drive cage assembly as described in claim 1, wherein the drive cage includes a top board, a bottom board and a pair of side walls connected between the top and the bottom boards, and wherein the top board forms a stepped portion for abutting against the panel.

3. The panel and drive cage assembly as described in claim 2, wherein each side wall forms a tab for abutting against the panel.

4. The panel and drive cage assembly as described in claim 3, wherein each tab forms a hole therein, and wherein the panel defines a pair of apertures aligned with the holes of the tabs for receiving fasteners.

5. An enclosure assembly comprising:
   a vertical panel defining at least an opening with a plurality of fingers slightly obliquely inwardly forwardly extending circumferentially around a periphery of the opening; and
   a drive cage defining a plurality of protrusions dimensioned to comply with said opening and extending forwardly through said opening; wherein
   said fingers and the protrusions are overlapped and electrically and mechanically engaged with each other.

* * * * *